United States Patent
Nasu et al.

(10) Patent No.: US 6,353,337 B2
(45) Date of Patent: Mar. 5, 2002

(54) LOAD CAPACITANCE MEASURING CIRCUIT AND OUTPUT BUFFER ADAPTIVE TO WIDE RANGE OF LOAD CAPACITANCE

(75) Inventors: Koji Nasu; Kiyoshi Adachi, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/739,246

(22) Filed: Dec. 19, 2000

(30) Foreign Application Priority Data

Jul. 17, 2000 (JP) ........................................ 2000-216314

(51) Int. Cl.[7] ........................ H03K 19/094; G01R 27/26
(52) U.S. Cl. ........................... 326/83; 326/88; 327/143; 327/198; 324/678; 324/679; 324/676
(58) Field of Search ..................... 326/83, 88; 327/143, 327/198; 324/678, 679, 676

(56) References Cited

U.S. PATENT DOCUMENTS

| | | | |
|---|---|---|---|
| 5,619,147 A | * | 4/1997 | Hunley ........................ 326/26 |
| 5,857,164 A | * | 1/1999 | Wakita ........................ 702/64 |
| 5,973,512 A | * | 10/1999 | Baker ........................ 326/87 |

FOREIGN PATENT DOCUMENTS

JP 5-41651 2/1993

* cited by examiner

*Primary Examiner*—Michael Tokar
*Assistant Examiner*—Vibol Tan
(74) *Attorney, Agent, or Firm*—Burns, Doane, Swecker & Mathis, LLP

(57) ABSTRACT

An output buffer includes a reference capacitor; a constant current source connected in series with the reference capacitor, for generating a reference voltage with a constant gradient by charging the reference capacitor; a first transistor having its source connected to a capacitive load, and its gate connected to the connecting point of the reference capacitor and the first constant current source to be supplied with the reference voltage; a second transistor connected between the drain of the first transistor and a voltage source; a third transistor connected between the capacitive load and the voltage source; and a fourth transistor connected to the control terminal of the second transistor and to the control terminal of the third transistor, for switching the second and third transistors from an OFF state to an ON state when the first transistor is turned on. It solves a problem of a conventional output buffer in that when the load capacitance of an external circuit differs from a presupposed one, it cannot meet the specification of the slew rate, or can consume excessive power.

13 Claims, 9 Drawing Sheets

LOAD CAPACITANCE MEASURING CIRCUIT AND OUTPUT BUFFER ADAPTIVE TO WIDE RANGE OF LOAD CAPACITANCE

BACKGROUND OF THE INVENTION

1. Field of the Invention

The present invention relates to a load capacitance measuring circuit for measuring the capacitance of a capacitive load of an external circuit, and to an output buffer capable of controlling its driving power in accordance with the capacitance of a capacitive load of an external circuit.

2. Description of Related Art

As a protocol for connecting a host with a device (hard disk drive), there is a standard called ATA interface. In the ATA interface, the load capacitance of an external circuit connected to an output buffer varies greatly depending on a usage mode. For example, one or two devices can be connected to a single host, and a flat cable or other cables can be used for connecting the host to the devices. These conditions can vary the load capacitance of the external circuit. In addition, since the ATA interface protocol specifies the maximum slew rate and maximum delay time of the output signal, it is necessary to provide the load driving power corresponding to the load capacitance to meet the specification. It holds true not only for the output buffers connected to the ATA interface, but also for any output buffers connected to external circuits that the output buffers with appropriate load driving power must be used to implement desired output signals in terms of rising time and the like.

FIG. 11 is a circuit diagram showing a configuration of a semiconductor integrated circuit including a conventional output buffer. In FIG. 11, the reference numeral 100 designates a semiconductor integrated circuit; 101 designates an internal circuit; 102 designates an output buffer; 103 designates an output terminal; 104 designates an inverter for inverting amplification; and 105, 106 and 107 designate inverters connected in parallel with each other. In the manufacturing process, the number of the inverters connected in parallel or the channel widths of the transistors constituting the inverters are adjusted in order to adjust the load driving power of the output buffer to an appropriate level, considering the load capacitance of an external circuit to be connected to the output buffer 102 so that an output signal with suitable driving power is produced for the load capacitance.

With the foregoing configuration, the conventional output buffer has a problem of being unable to meet the specification concerning the slew rate or delay time, if the load capacitance of the external circuit is greater than the assumed load capacitance, and hence the load driving power of the output buffer is relatively small, because the heavy load hinders the output signal from providing an enough rising or falling time required.

On the other hand, if the load capacitance of the external circuit is smaller than the assumed load capacitance, the load driving power of the output buffer becomes relatively large, presenting another problem of consuming excessive power.

SUMMARY OF THE INVENTION

The present invention is implemented to solve the foregoing problem. It is therefore an object of the present invention to provide a load capacitance measuring circuit capable of measuring the capacitance of a capacitive load of an external circuit.

Another object of the present invention is to provide an output buffer capable of adjusting the load driving power in accordance with the capacitance of the capacitive load of an external circuit.

According to a first aspect of the present invention, there is provided a load capacitance measuring circuit comprising: a reference capacitor; a constant current source connected in series with the reference capacitor, for generating a reference voltage with a constant gradient in the reference capacitor; a load resistor; and a transistor having its source connected to a capacitive load to be measured, its gate connected to a connecting point of the reference capacitor and the constant current source to be supplied with the reference voltage, and its drain connected to a voltage source via the load resistor, wherein a capacitance of the capacitive load is obtained from the drain voltage of the transistor and the gradient of the reference voltage.

Here, a capacitance of the reference capacitor may be variable.

A constant current the constant current source outputs may be variable.

According to a second aspect of the present invention, there is provided an output buffer comprising: a reference capacitor; a first constant current source connected in series with the reference capacitor, for generating a reference voltage with a constant gradient by charging the reference capacitor; a first transistor having its source connected to a capacitive load, and its gate connected to a connecting point of the reference capacitor and the first constant current source to be supplied with the reference voltage; a first switching device connected between the drain of the first transistor and a voltage source; a second switching device connected between the capacitive load and the voltage source; and a first driver connected to a control terminal of the first switching device and to a control terminal of the second switching device, for switching the first switching device and the second switching device from an OFF state to an ON state when the first transistor is turned on.

Here, the output buffer may further comprise: a second constant current source connected in series with the reference capacitor, for changing the reference voltage at a constant rate by discharging the reference capacitor; a second transistor having its source connected to the capacitive load, and its gate connected to a connecting point of the reference capacitor and the second constant current source to be supplied with the reference voltage; a third switching device connected between the drain of, the second transistor and a ground; a fourth switching device connected between the capacitive load and the ground; and a second driver connected to a control terminal of the third switching device and to a control terminal of the fourth switching device, for switching the third switching device and the fourth switching device from an OFF state to an ON state when the second transistor is turned on.

A capacitance of the reference capacitor may be variable.

A constant current supplied from the first constant current source to the reference capacitor may be variable.

A constant current discharged from the reference capacitor by the second constant current source may be variable.

According to a third aspect of the present invention, there is provided an output buffer comprising: a reference capacitor; a first constant current source connected in series with the reference capacitor, for generating a reference voltage with a constant gradient by charging the reference capacitor; a first transistor having its source connected to a capacitive load, and its gate connected to a connecting point of the reference capacitor and the first constant current source to be supplied with the reference voltage; a first switching device connected between the drain of the first transistor and a voltage source; a second switching device connected between the capacitive load and the voltage source; and a third switching device that is connected between a control terminal of the first switching device and a control terminal of the second switching device, and controlled by a voltage across the capacitive load.

Here, the output buffer may further comprise: a second constant current source connected in series with the reference capacitor, for changing the reference voltage at a constant rate by discharging the reference capacitor; a second transistor having its source connected to the capacitive load, and its gate connected to a connecting point of the reference capacitor and the second constant current source to be supplied with the reference voltage; a fourth switching device connected between the drain of the second transistor and the ground; a fifth switching device connected between the capacitive load and the ground; and a sixth switching device that is connected between a control terminal of the fourth switching device and a control terminal of the fourth switching device, and controlled by the voltage across the capacitive load.

A capacitance of the reference capacitor may be variable.

A constant current supplied from the first constant current source to the reference capacitor may be variable.

A constant current discharged from the reference capacitor by the second constant current source may variable.

DETAILED DESCRIPTION OF THE PREFERRED EMBODIMENTS

The invention will now be described with reference to the accompanying drawings.

Embodiment 1

Figure 1:
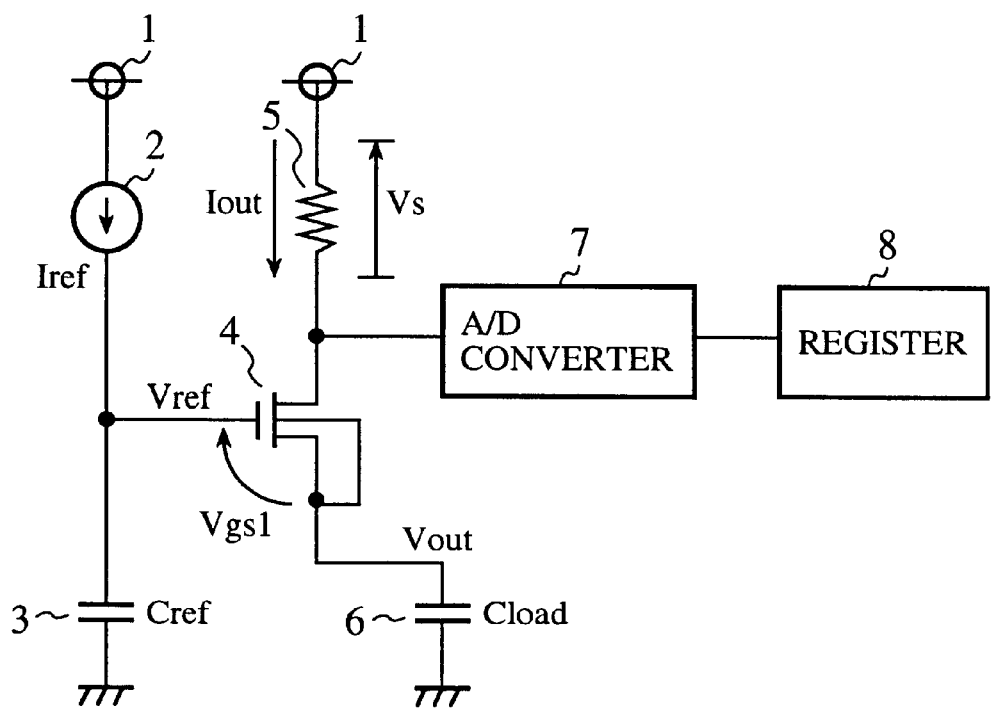
FIG. 1 is a circuit diagram showing a configuration of a load capacitance measuring circuit of an embodiment 1 in accordance with the present invention.

FIG. 1 is a circuit diagram showing a configuration of a load capacitance measuring circuit of an embodiment 1 in accordance with the present invention. In FIG. 1, the reference numeral 1 designates a voltage source; 2 designates a constant current source; 3 designates a capacitor for generating a constant gradient voltage in connection with the constant current source 2; 4 designates a source follower with its gate supplied with the voltage of the capacitor 3; 5 designates a load resistor interposed between the drain of the source follower 4 and the voltage source 1 for measuring a current; 6 designates a capacitive load to be measured connected to the source of the source follower 4; 7 designates an A/D converter for converting the drain voltage of the source follower 4 into digital data; and 8 designates a register for holding the digital voltage data.

Next, the operation of the present embodiment 1 will be described.

Figure 2:
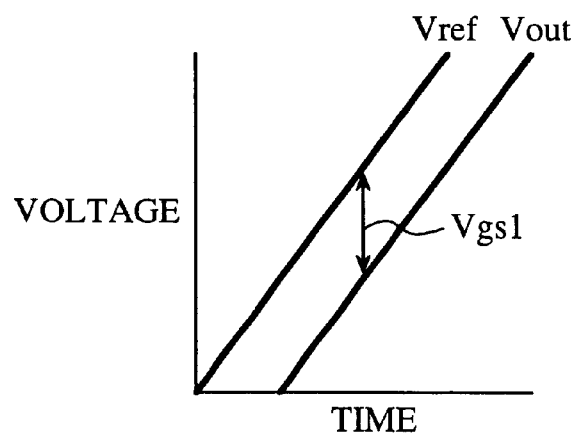
FIG. 2 is a graph illustrating variations in gate and source potentials of a source follower with time.

FIG. 2 is a graph illustrating variations in gate and source potentials of the source follower 4 with time. In FIG. 2, $V_{ref}$ designates the gate potential of the source follower 4, and $V_{out}$ designates the source potential of the source follower 4. As illustrated in FIG. 2, the voltage $V_{gs1}$ between the gate potential $V_{ref}$ and the source potential $V_{out}$ is maintained at a fixed value. The reason for this will be briefly described here. The drain current $I_{out}$ of the source follower 4 is expressed by $(\beta/2) \times (V_{gs1} - V_{thn})$, where $\beta$ is a constant associated with a characteristic of the transistor, and $V_{thn}$ is a threshold voltage of the transistor. If the $V_{gs1}$ exceeds the particular level, the $I_{out}$ increases so that the gradient of the $V_{out}$ becomes greater than that of the $V_{ref}$, thereby reducing the $V_{gs1}$. In contrast, when the $V_{gs1}$ falls below the particular level, the $I_{out}$ reduces so that the gradient of the $V_{out}$ becomes smaller than that of the $V_{ref}$, thereby increasing the $V_{gs1}$. In this way, the gradient of the gate potential $V_{ref}$ and the gradient of the source potential $V_{out}$ converge on the same state, resulting in holding the voltage $V_{gs1}$ at the fixed value.

Supplying the current $I_{ref}$ from the constant current source 2 will make the voltage level $V_{ref}$ of the capacitor 3, $V_{ref} = \int I_{ref} dt / C_{ref}$, where $C_{ref}$ is the capacitance of the capacitor 3. Accordingly, the constant current source 2 and the capacitor 3 generates the constant gradient voltage, and supplies it to the gate of the source follower 4. In addition, on the source side of the source follower 4, such source potential $V_{out}$ is generated as maintaining the fixed voltage $V_{gs1}$ for the gate potential $V_{ref}$. Besides, since the relationship between the load capacitance $C_{load}$ of the capacitive load 6 and the drain current $I_{out}$ of the source follower 4 is expressed by $I_{out} = C_{load} \times dV_{out}/dt$, and the voltage gradient $(dV_{out}/dt)$ of the source potential $V_{out}$ is constant, the current $I_{out}$ takes a fixed value proportional to the capacitance $C_{load}$ of the capacitive load 6. Thus, the voltage drop $V_s$ across the load resistor 5 becomes a fixed value uniquely determined from the value of the capacitance $C_{load}$. Then, the drain voltage $E-V_s$ of the source follower 4, where E is the voltage of the voltage source 1, is converted into digital data by the A/D converter 7 to be stored in the register 8. Accordingly, the capacitance $C_{load}$ of the capacitive load 6 can be calculated from the value stored in the register 8.

Here, the relationship between the capacitance $C_{load}$ and the voltage drop $V_s$ will be obtained. First, as for the capacitive load 6, the following expression (1) holds.

$$V_{out} = \int I_{out} dt / C_{load} \quad (1)$$

Since $$dV_{out}/dt = dV_{ref}/dt,$$

$$dV_{ref}/dt = I_{out}/C_{load} \quad (2)$$

The following expression (3) holds as to the voltage drop $V_s$.

$$V_s = I_{out} \times R_s \quad (3)$$

where $R_s$ is the resistance of the load resistor 5. From the expressions (2) and (3), the capacitance $C_{load}$ can be obtained by the following expression (4).

$$C_{load} = V_s / \{R_s \times (dV_{ref}/dt)\} \quad (4)$$

As described above, the present embodiment 1 is configured such that it comprises the source follower 4 having its source connected to the capacitive load 6 whose capacitance is to be measured; the resistor 5 having its first terminal connected to the drain of the source follower 4; the voltage source 1 connected to the second terminal of the resistor 5; the capacitor 3 connected to the gate of the source follower 4; and the constant current source 2 connected to the gate of the source follower 4 together with the capacitor 3. Thus, it can apply the constant gradient voltage generated by the constant current source 2 and the capacitor 3 to the gate of the source follower 4, thereby generating the voltage with the same gradient on the source side of the source follower 4. As a result, it offers an advantage of being able to calculate the capacitance of the capacitive load 6 by measuring the voltage drop across the load resistor 5 because the drain current of the source follower 4 is uniquely determined by the capacitance of the capacitive load 6.

Embodiment 2

Figure 3:
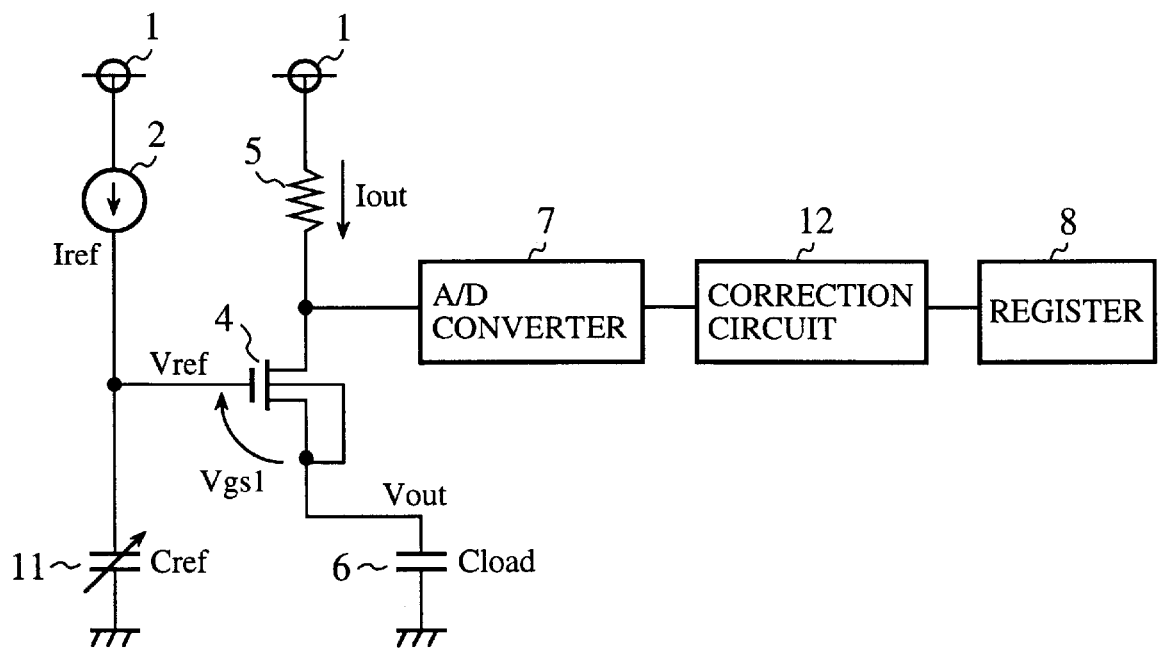
FIG. 3 is a circuit diagram showing a configuration of a load capacitance measuring circuit of an embodiment 2 in accordance with the present invention.

FIG. 3 is a circuit diagram showing a configuration of a load capacitance measuring circuit of an embodiment 2 in accordance with the present invention. In FIG. 3, the same reference numerals designate the same or like portions to those of FIG. 1, and the description thereof is omitted here. In FIG. 3, the reference numeral 11 designates a variable capacitor; and 12 designates a correction circuit for carrying out voltage correction in accordance with the change of the capacitance of the capacitor 11.

Figure 4:
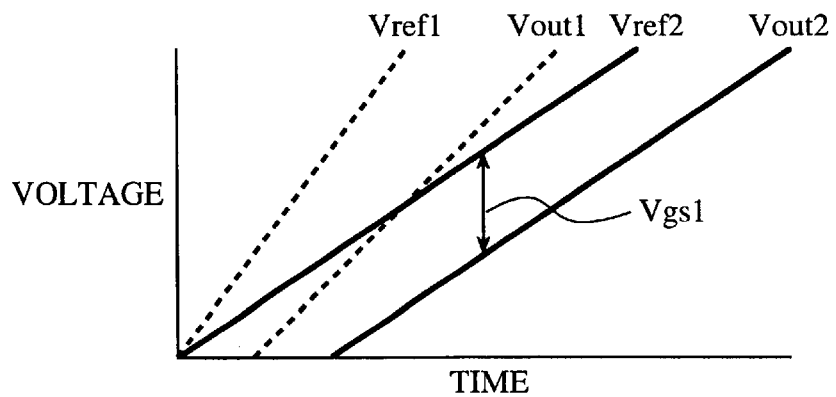
FIG. 4 is a graph illustrating variations in gate and source potentials of a source follower with time.

FIG. 4 is a graph illustrating time variations in the gate potential and source potential of the source follower 4. In the load capacitance measuring circuit in the embodiment 1, when the capacitance of the capacitive load 6 exceeds a particular value, the source follower 4 cannot feed the current beyond its current amplification factor. Accordingly, the voltage $V_{gs1}$ between the gate potential and the source potential cannot be maintained at the fixed value as illustrated by dotted lines ($V_{ref1}$ and $V_{out1}$) in FIG. 4. If the voltage $V_{gs1}$ cannot be maintained at the fixed value, the change of the expression (2) described in the embodiment 1 cannot be made, which means that the measurement of the capacitance $C_{load}$ is impossible.

In view of this, the load capacitance measuring circuit of the present embodiment 2 makes the capacitance $C_{ref}$ of the capacitor 11 variable so that when it is necessary to extend the measuring range of the capacitance of the capacitive load 6, the capacitance $C_{ref}$ of the capacitor 11 is increased to reduce the gradient of the gate and source potentials as illustrated by solid lines ($V_{ref2}$ and $V_{out2}$) in FIG. 4. This makes it possible to reduce the drain current $I_{out}$ flowing through the capacitive load 6, and hence to maintain the voltage $V_{gs1}$ between the gate potential and the source potential. However, since the relationship between the capacitance $C_{load}$ of the capacitive load 6 and the drain current $I_{out}$ (voltage drop $V_s$) changes with the change of the capacitance $C_{ref}$ of the capacitor 11, it is preferable to provide the correction circuit 12 for correcting the digital data after the A/D conversion in response to the change in the relationship.

As described above, since the present embodiment 2 comprises the variable capacitor 11, it can extend the measuring range of the capacitance of the capacitive load 6 by varying the capacitance of the capacitor 11, thereby enabling the voltage $V_{gs1}$ between the gate potential and the source potential of the source follower 4 to be maintained at the fixed value. As a result, it offers an advantage of being able to measure the capacitance of the capacitive load 6 in a wider range, and to optionally set the measurable range of the capacitance of the capacitive load 6.

Embodiment 3

The load capacitance measuring circuit of an embodiment 3 in accordance with the present invention is basically the same in the configuration as the load capacitance measuring circuit of the embodiment 1 as shown in FIG. 1. It differs from the embodiment 1 in that it can vary the amount of the current the constant current source 2 supplies.

In the load capacitance measuring circuit in the present embodiment 3, the amount of the current $I_{ref}$ supplied from the constant current source 2 to the capacitor 11 is made variable. To extend the measuring range of the capacitance of the capacitive load 6, the amount of the current $I_{ref}$ supplied from the constant current source 2 to the capacitor 11 is reduced so that the gradient of the gate potential and source potential of the source follower 4 is reduced, and hence the amount of the drain current $I_{out}$ flowing through the capacitive load 6 is decreased, thereby maintaining the voltage $V_{gs1}$ between the gate potential and the source potential at the fixed value. However, since the relationship between the capacitance $C_{load}$ of the capacitive load 6 and the drain current $I_{out}$ (voltage drop $V_s$) changes with the change of the amount of the current $I_{ref}$ the constant current source 2 supplies, it is preferable to provide the correction circuit 12 for correcting the digital data after the A/D conversion in response to the change in the relationship.

As described above, since the present embodiment 3 comprises the constant current source 2 with its current amount variable, it can expand the measuring range of the capacitance of the capacitive load 6 by varying the amount of the current supplied from the constant current source 2 in order to maintain the voltage $V_{gs1}$ between the gate potential and the source potential of the source follower 4 at the fixed value. As a result, it offers an advantage of being able to measure the capacitance of the capacitive load 6 in a wider range, and to optionally set the measurable range of the capacitance of the capacitive load 6.

Embodiment 4

In the present embodiment 4 in accordance with the present invention, an output buffer will be described which utilizes the load capacitance measuring circuit described in the foregoing embodiments 1–3. The output buffer of the embodiment 4 comprises a rising signal output circuit and a falling signal output circuit, in which the former raises the voltage level of the capacitive load to an "H" level when the input signal rises to the "H" level, and the latter drops the voltage level of the capacitive load to an "L level" when the input signal falls to the "L level".

Figure 5:
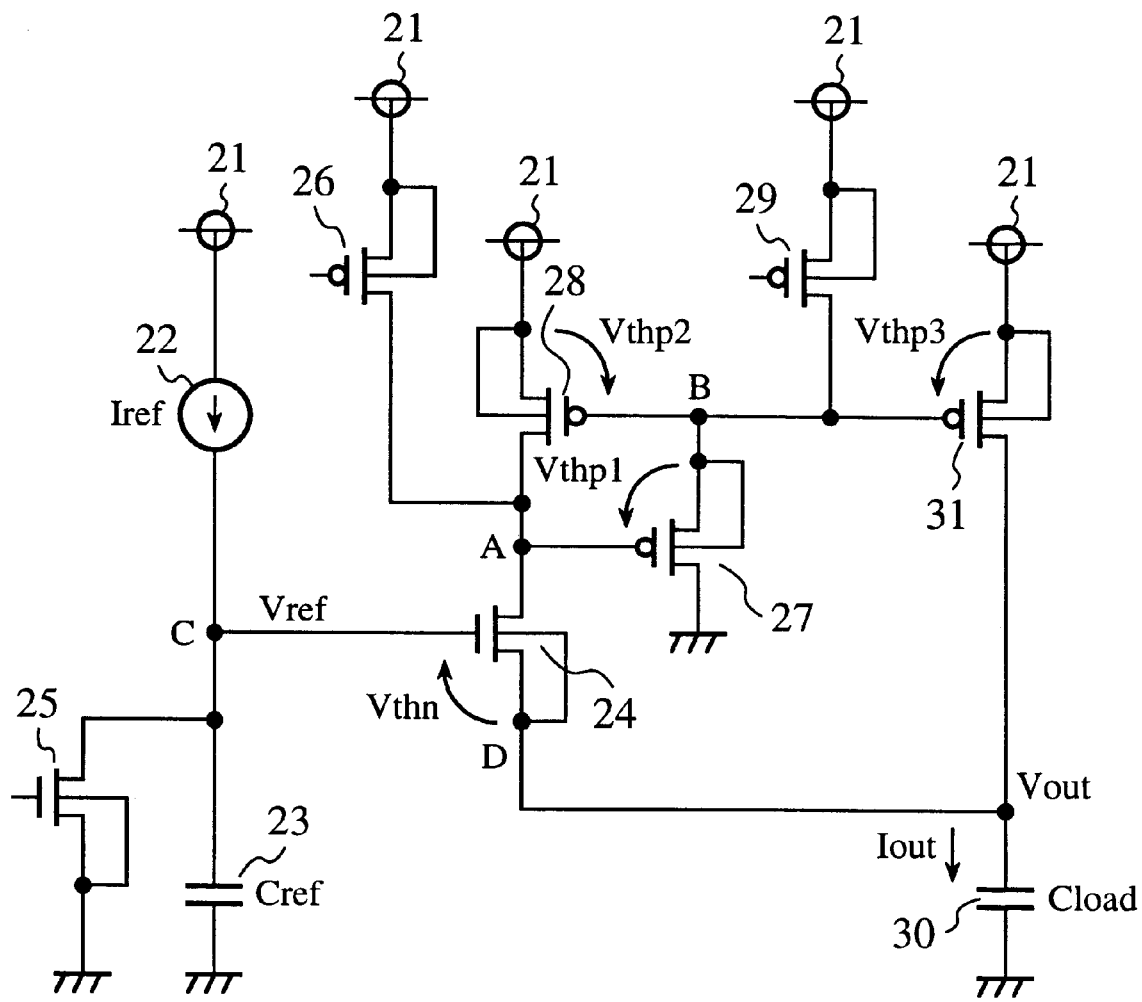
FIG. 5 is a circuit diagram showing a configuration of a rising signal output circuit constituting an output buffer of an embodiment 4 in accordance with the present invention.

FIG. 5 is a circuit diagram showing a configuration of a rising signal output circuit constituting the output buffer of the embodiment 4 in accordance with the present invention. In FIG. 5, the reference numeral 21 designates a voltage source; 22 designates a constant current source; 23 designates a capacitor for generating a constant gradient voltage in conjunction with the constant current source 22; 24 designates a source follower consisting of an N-channel transistor having its gate supplied with the voltage level of the capacitor 23; 25 designates an N-channel transistor for initializing the voltage level of the capacitor 23 to zero volt; 26 designates a P-channel transistor for initializing the drain potential of the source follower 24 to the supply voltage $V_{dd}$; 27 designates a P-channel transistor having its gate connected to the drain of the source follower 24; 28 designates a P-channel transistor having its drain connected to the drain of the source follower 24, its gate connected to the source of the P-channel transistor 27, and its source connected to the voltage source 21; 29 designates a P-channel transistor for initializing the gate potential of the P-channel transistor 28 and the gate potential of a P-channel transistor 31 to the supply voltage $V_{dd}$; 30 designates a capacitive load connected to the source of the source follower 24; and 31 designates a P-channel transistor connected between the capacitive load 30 and the voltage source 21 for raising the voltage level of the capacitive load 30 to the supply voltage $V_{dd}$. Major points in the operation of the rising signal output circuit are designated by reference symbols A, B, C and D to identify them easily.

Next, the operation of the present embodiment 4 will be described.

First, when the rising signal output circuit is in a disabled state, an "H" level signal is applied to the gate of the N-channel transistor 25, and an "L" level signal is applied to the gates of the P-channel transistors 26 and 29. Thus, these transistors are turned on so that the potentials at points A and B are maintained at the supply voltage $V_{dd}$, and the potential $V_{ref}$ at the point C is maintained at zero volt. Being maintained at the supply voltage $V_{dd}$, the potentials at the points A and B bring the P-channel transistors 27, 28 and 31 into an OFF state during the disabled state.

Next, when the input signal rises to the "H" level, the rising signal output circuit shifts from the disabled state to the enabled state, in which case, the gate potential of the N-channel transistor 25 becomes "L" level, and the gate potentials of the P-channel transistors 26 and 29 become "H" level. At the same time, the constant current source 22 is turned on.

Figure 6:
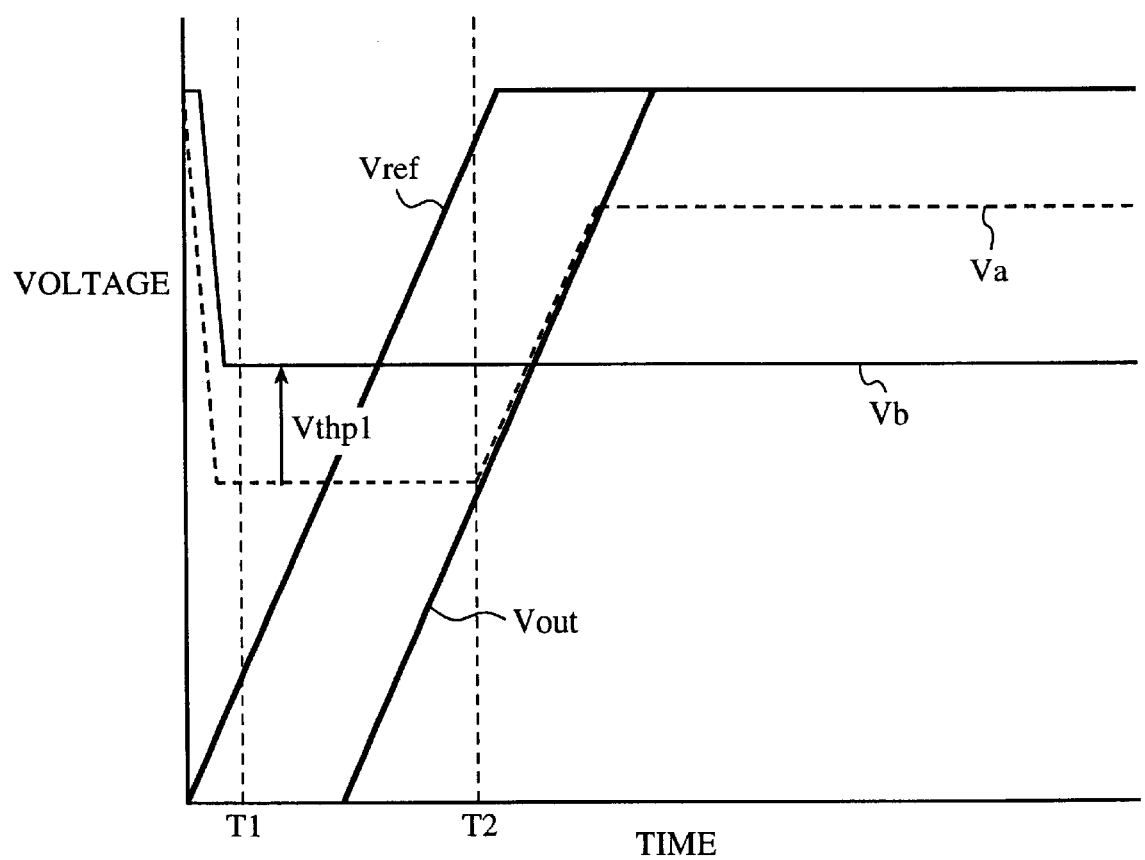
FIG. 6 is a graph illustrating variations in potentials at main points with time after a constant current source is turned on in the rising signal output circuit of the embodiment 4 in accordance with the present invention.

FIG. 6 is a graph illustrating temporal variations in the potentials at the main points after the constant current source is turned on in the rising signal output circuit of the present embodiment 4. When the constant current source 22 is turned on, the charge in the capacitor 23 increases linearly, raising the voltage level of the capacitor 23. Thus, when the gate-source voltage of the source follower 24 exceeds the threshold voltage $V_{thn}$, the source follower 24 is turned on. In this case, the potential $V_a$ at the point A falls while the voltage level $V_{out}$ of the capacitive load 30 is low. In response to the fall of the potential $V_a$ triggered by the switching on of the source follower 24, the gate-source voltage of the P-channel transistor 27 exceeds the threshold voltage $V_{thp1}$ so that it is turned on and drops the potential $V_b$ at the point B. In response to the drop in the potential $V_b$, the gate-source voltage of the P-channel transistor 28 exceeds the threshold voltage $V_{thp2}$ so that it is turned on. Likewise, the gate-source voltage of the P-channel transistor 31 exceeds the threshold voltage $V_{thp3}$, tuning it on. Thus, the current $I_{out}$ flows into the capacitive load 30 from the voltage source 21 through the P-channel transistor 28 and source follower 24, and through the P-channel transistor 31. Here, the current $I_{out}$ refers to the sum total of the current flowing into the capacitive load 30.

While the current $I_{out}$ is flowing into the capacitive load 30, the potential at the point C, that is, the gate potential of the source follower 24 increases at a rate of $I_{ref}/C_{ref}$, where $I_{ref}$ is the amount of the current supplied from the constant current source 22 to the capacitor 23, and $C_{ref}$ is the capacitance of the capacitor 23, so that the potential at the point D increases at the same rate with maintaining the voltage $V_{gs1}$. Accordingly, the amount of the current $I_{out}$ flowing into the capacitive load 30 is expressed by the following expression (5):

$$I_{out}=(C_{load}/C_{ref})\times I_{ref} \tag{5}$$

where $C_{load}$ is the capacitance of the capacitive load 30.

The potential at the point B is uniquely determined such that the amount of the current flowing into the capacitive load 30 becomes equal to $I_{out}$. The potentials at the points A and B in this state are obtained by the following expressions (6) and (7), respectively.

$$V_b=V_{dd}-(V_{thp2}+sqrt(I_1/K)) \tag{6}$$

$$V_a=V_b-V_{thp1} \tag{7}$$

where $I_1$ is the value of the current flowing through the P-channel transistor 28, and K is a transconductance coefficient of the P-channel transistor 28.

With the elapse of the time from this state, the capacitive load 30 is being charged by the current $I_{out}$, so that the $V_a$ increases with the $V_{out}$ after time T2 at which the voltage $V_a$ becomes $V_a=V_{out}$ as illustrated in FIG. 6. In this case, when the gate-source voltage of the P-channel transistor 27 drops below the threshold voltage $V_{thp1}$, the P-channel transistor 27 is turned off and the potential $V_b$ is maintained at a fixed value. After that, the current $I_{out}$ approximately proportional to the capacitance $C_{load}$ flows into the capacitive load 30. Here, if the source follower 24 continues the ON state when the voltage level of the capacitor 23 increases to the supply voltage $V_{dd}$, the voltage between the gate and source of the source follower 24 becomes greater than the threshold voltage Vthn. Accordingly, the source follower 24 cannot raise the voltage level of the capacitive load 30 to the supply voltage $V_{dd}$. Thus, in a range where the voltage level of the capacitive load 30 is close to the supply voltage $V_{dd}$, only the P-channel transistor 31 supplies the current to the capacitive load 30. In this case, since the potential $V_b$ is maintained at the fixed value, the current corresponding to the capacitance $C_{load}$ of the capacitive load 30 flows into the capacitive load 30.

As described above, according to the present embodiment 4, when the input signal applied to the rising signal output circuit rises to the "H" level, the current $I_{out}$ approximately proportional to the capacitance $C_{load}$ of the capacitive load 30 flows therein to at first as clearly indicated in expression (5), and then the current corresponding to the capacitance $C_{load}$ is supplied to the capacitive load 30 even in the range where the voltage level of the capacitive load 30 increases close to the supply voltage $V_{dd}$. As a result, it can provide the load driving power matching the load capacitance, and set an optimum slew rate and delay time by appropriately determining the amount of the current $I_{ref}$ supplied from the constant current source 22 to the capacitor 23, and the capacitance $C_{ref}$ of the capacitor 23.

Figure 7:
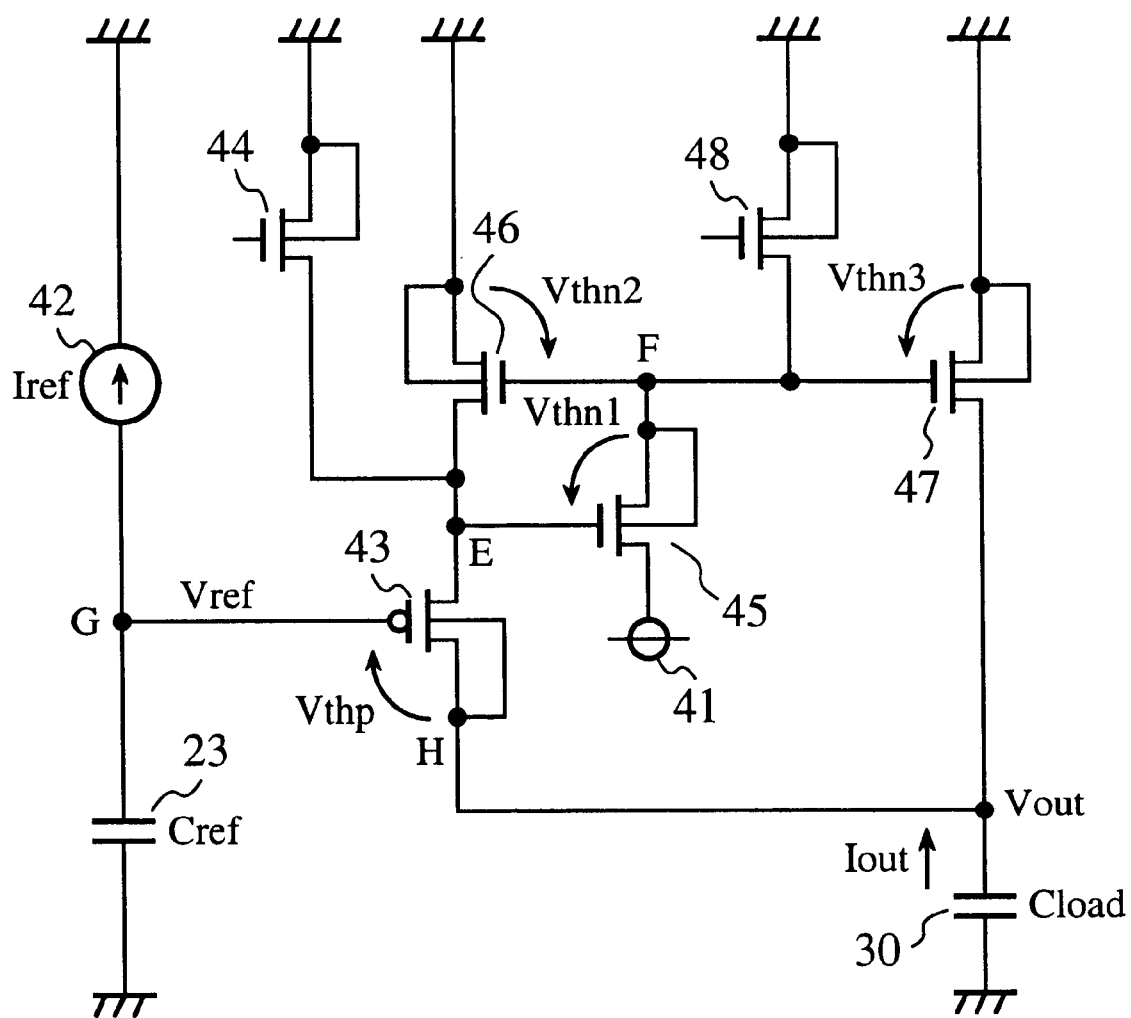
FIG. 7 is a circuit diagram showing a configuration of a falling signal output circuit constituting the output buffer of the embodiment 4 in accordance with the present invention.

As for a falling signal output circuit constituting the output buffer of the embodiment 4 in accordance with the present invention, it can be implemented using a circuit configuration analogous to that of the rising signal output circuit. FIG. 7 is a circuit diagram showing a configuration of the falling signal output circuit constituting the output buffer of the embodiment 4. In FIG. 7, the falling signal output circuit is configured such that it shares the capacitor 23 and the capacitive load 30 with the rising signal output circuit, and extracts the charges stored in the capacitor 23 and capacitive load by the rising signal output circuit. In FIG. 7, the reference numeral 41 designates a voltage source; 42 designates a constant current source; 43 designates a source follower consisting of a P-channel transistor having its gate supplied with the voltage level of the capacitor 23; 44 designates an N-channel transistor for initializing the drain potential of the source follower 43 to zero volt; 45 designates an N-channel transistor having its gate connected to the drain of the source follower 43; 46 designates an N-channel transistor having its drain connected to the drain of the source follower 43, its gate connected to the source of the N-channel transistor 45, and its source connected to a ground; 47 designates an N-channel transistor connected between the capacitive load 30 and the ground for dropping the voltage level of the capacitive load 30 to zero volt, and having its gate connected to the source of the transistor 45; and 48 designates an N-channel transistor for initializing the gate potentials of the N-channel transistors 46 and 47 to zero volt. In FIG. 7, major points in the operation of the falling signal output circuit are designated by reference symbols E, F, G and H to make their identification, easy.

Next, the operation of the falling signal output circuit of the present embodiment 4 will be described.

First, when the falling signal output circuit is in the disabled state, the "H" level signal is applied to the gates of the N-channel transistors 44 and 48 so that the two transistors are turned on, and the potentials at the points E and F are maintained at zero volt. Being thus maintained at zero volt, the potentials at the points E and F bring the N-channel transistors 45, 46 and 47 into the OFF state in the disabled state.

Subsequently, when the input signal drops to the "L" level, the falling signal output circuit shifts from the disabled state to the enabled state, and the gate potentials of the N-channel transistors 44 and 48 become "L" level. At the same time, the constant current source 42 is turned on.

In response to the turning on of the constant current source 42, the capacitor 23 starts discharging, and its voltage level $V_{ref}$ starts dropping. Thus, when the gate-source voltage of the source follower 43 exceeds the threshold voltage $V_{thp}$, the source follower 43 is turned on, and the potential $V_e$ at the point E increases. When the gate-source voltage of the N-channel transistor 45 exceeds the threshold voltage $V_{thn1}$ in response to the increase of the potential $V_e$, the N-channel transistor 45 is turned on, and the potential $V_f$ at the point F increases. When the gate-source voltage of the N-channel transistor 46 exceeds the threshold voltage $V_{thn2}$ in response to the increase of the potential $V_f$, the N-channel transistor 46 is turned on. Likewise, when the gate-source voltage of the N-channel transistor 47 exceeds the threshold voltage $V_{thn3}$, the N-channel transistor 47 is turned on. As a result, the current $I_{out}$ starts flowing from the capacitive load 30 to the ground through the N-channel transistor 46 and the source follower 43, and through the N-channel transistor 47. Here, the current $I_{out}$ is the sum total of the current flowing out of the capacitive load 30. The potential at the point F is uniquely determined such that the current flowing out of the capacitive load 30 becomes equal to the $I_{out}$ given by expression (5).

As the charges are pulled out of the capacitive load 30 because of the current $I_{out}$, the potential $V_e$ drops with the voltage level $V_{out}$ of the capacitive load 30. In this case, when the gate-source voltage of the N-channel transistor 45 falls below the threshold voltage $V_{thn1}$, the N-channel transistor 45 is turned off, but the potential $V_f$ is maintained at the fixed value so that the current $I_{out}$ approximately proportional to the capacitance $C_{load}$ of the capacitive load 30 continues to flow. If the source follower 43 continues the ON state when the voltage level of the capacitor 23 falls to zero volt, the voltage between the gate and source of the source follower 43 is greater than the threshold voltage $V_{thp}$. Accordingly, the source follower 43 alone cannot drop the voltage level of the capacitive load 30 to zero volt. Thus, in a range where the voltage level of the capacitive load 30 is close to zero volt, only the N-channel transistor 47 passes the current to the ground. In this case, since the potential $V_f$ is maintained at the fixed value because the transistor 45 is turned off owing to the drop of the drain potential of the source follower 43, the current corresponding to the capacitance $C_{load}$ of the capacitive load 30 continues to flow out of the capacitive load 30.

As described above, according to the present embodiment 4, when the input signal to the falling signal output circuit drops to the "L" level, the current $I_{out}$ approximately proportional to the capacitance $C_{load}$ of the capacitive load 30 flows at first as in the rising signal output circuit, and then, in the range where the voltage level of the capacitive load 30 drops close to zero volt, the current corresponding to the capacitance $C_{load}$ is pulled out of the capacitive load 30. As a result, the falling signal output circuit can provide the load driving power that matches the load capacitance, and set an optimum slew rate and delay time by appropriately determining the amount of the current $I_{ref}$ supplied from the constant current source 42 to the capacitor 23 and its capacitance $C_{ref}$.

As described above, the present embodiment 4 is configured such that it comprises the source follower 24 (43) having its source connected to the capacitive load 30; the capacitor 23 connected to the gate of the source follower 24 (43); the constant current source 22 (42) connected to the capacitor 23 and the gate of the source follower 24 (43); the P-channel transistor 28 (N-channel transistor 46) connected between the drain of the source follower 24 (43) and the voltage source (ground); the P-channel transistor 31 (N-channel transistor 47) connected between the capacitive load 30 and the voltage source (ground); and the P-channel transistor 27 (N-channel transistor 45) connected to the gates of the P-channel transistors 28 and 31 (N-channel transistors 46 and 47) for switching them on using the turning on of the source follower 24 (43) as the trigger. Accordingly, by turning on the source follower 24 (43) by supplying its gate with the constant gradient voltage, which is generated by the constant current source 22 (42) and the capacitor 23 using the transition of the input signal as a trigger, the P-channel transistors 28 and 31 (N-channel transistors 46 and 47) are turned on through the P-channel transistor 27 (N-channel transistor 45). This makes it possible for the current approximately proportional to the capacitance $C_{ref}$ of the capacitive load 30 to flow into or out of the capacitive load 30, offering an advantage of being able to implement the load driving power corresponding to the load capacitance.

Furthermore, providing the P-channel transistor 31 (N-channel transistor 47) between the capacitive load 30 and the voltage source (ground) offers an advantage of being able to raise the voltage level of the capacitive load 30 to the supply voltage $V_{dd}$ (to drop it to zero volt)

Moreover, appropriately setting the amount of the current $I_{ref}$ supplied from the constant current source 22 (42) or the capacitance $C_{ref}$ of the capacitor 23 makes it possible to control the amount of the current $I_{out}$ flowing into (extracted from) the capacitive load 30, offering an advantage of being able to establish the optimum slew rate and delay time.

Embodiment 5

Like the output buffer of the foregoing embodiment 4, the output buffer of the present embodiment 5 comprises the rising signal output circuit and the falling signal output circuit. Here again, the former raises the voltage level of the capacitive load to the "H" level when the input signal rises to the "H" level, and the latter drops it to the "L" level when the input signal falls to the "L" level.

Figure 8:
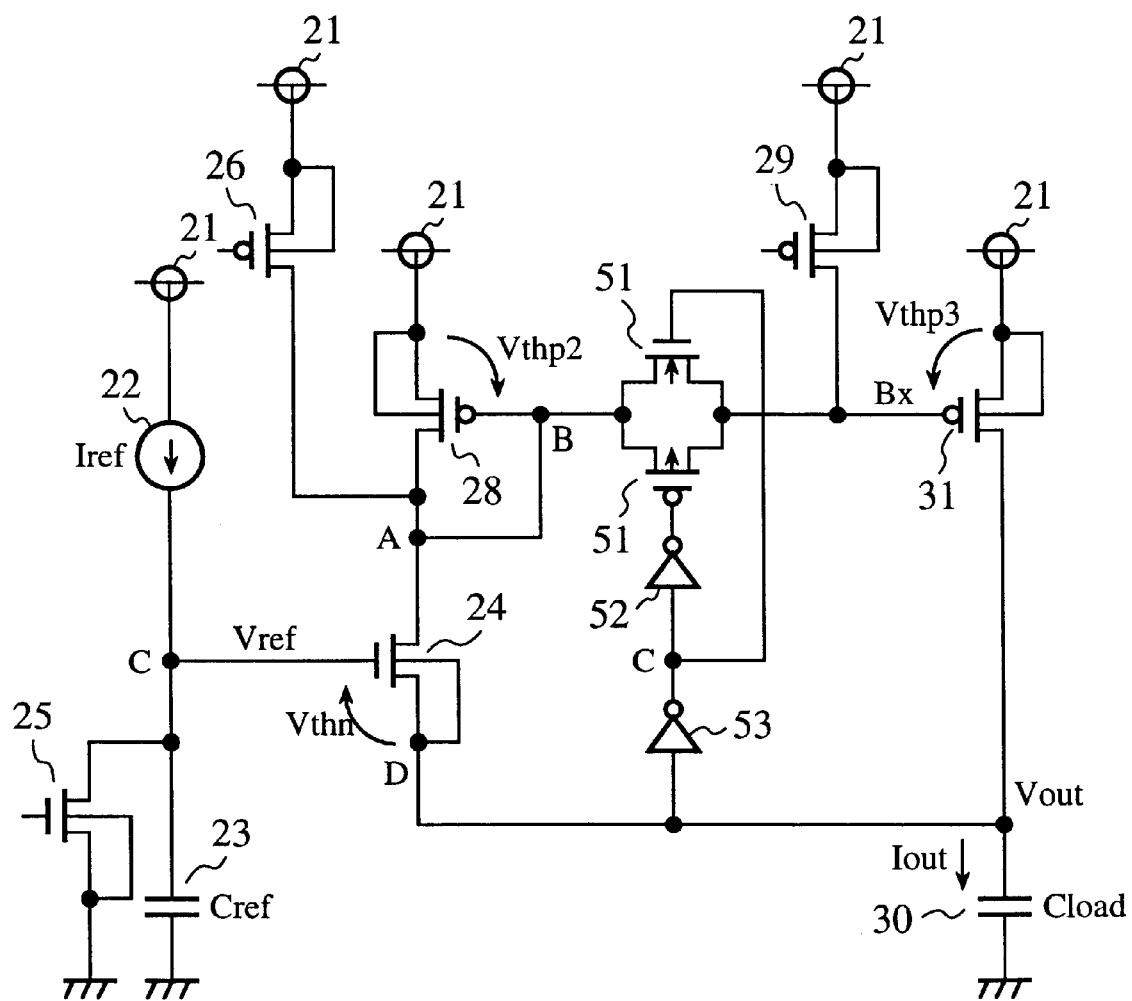
FIG. 8 is a circuit diagram showing a configuration of a rising signal output circuit constituting an output buffer of an embodiment 5 in accordance with the present invention.

FIG. 8 is a circuit diagram showing a configuration of a rising signal output circuit constituting the output buffer of the embodiment 5 in accordance with the present invention 5. In FIG. 8, the same reference numerals designate the same or like portions to those of FIG. 5, and the description thereof is omitted here. In FIG. 8, major points in the operation of the rising signal output 4; circuit are designated by the reference symbols A, B, Bx, C to make their identification easy. The reference numeral 51 designates a MOS switch (T gate) for controlling connection and disconnection between the points B and Bx; and reference numerals 52 and 53 each designate an inverter. The points B and Bx are connected when the potential at the point C as illustrated in the FIG. 8 is at the "H" level, and disconnected when it is at the "L" level.

Since the rising signal output circuit of the foregoing embodiment 4 has the voltage $V_{thp1}$ between the points A and B, the lower limit of the potential $V_b$ at the point B is $V_{thp1}$ so that the range of the potential $V_b$ becomes $V_{dd} \geq V_b \geq V_{thp1}$. Accordingly, when the supply voltage $V_{dd}$ is low, the range of the potential $V_b$ becomes narrow, resulting in a narrow controllable range of the amount of the current flowing into the capacitive load 30. Thus, the range of the load capacitance the rising signal output circuit can cover is also narrow. In view of this, the present embodiment 5 connects the points A and B to make zero the lower limit value of the potential $V_b$ at the point B.

Next, the operation of the rising signal output circuit of the present embodiment 5 will be described.

First, when the rising signal output circuit is in a disabled state, the "H" level signal is applied to the gate of the N-channel transistor 25, and the "L" level signal is applied to the gates of the P-channel transistors 26 and 29. Thus, these transistors are turned on so that the potentials at points A, B and Bx are maintained at the supply voltage $V_{dd}$, and the gate potential $V_{ref}$ of the source follower 24 is maintained at zero volt. Being maintained at the supply voltage $V_{dd}$, the potentials at the points B and Bx place the P-channel transistors 28 and 31 at the OFF state during the disabled state.

Subsequently, when the input signal rises to the "H" level, the rising signal output circuit shifts from the disabled state to the enabled state, in which case, the gate potential of the N-channel transistor 25 becomes "L" level, and the gate potentials of the P-channel transistors 26 and 29 become "H" level. At the same time, the constant current source 22 is turned on.

Figure 9:
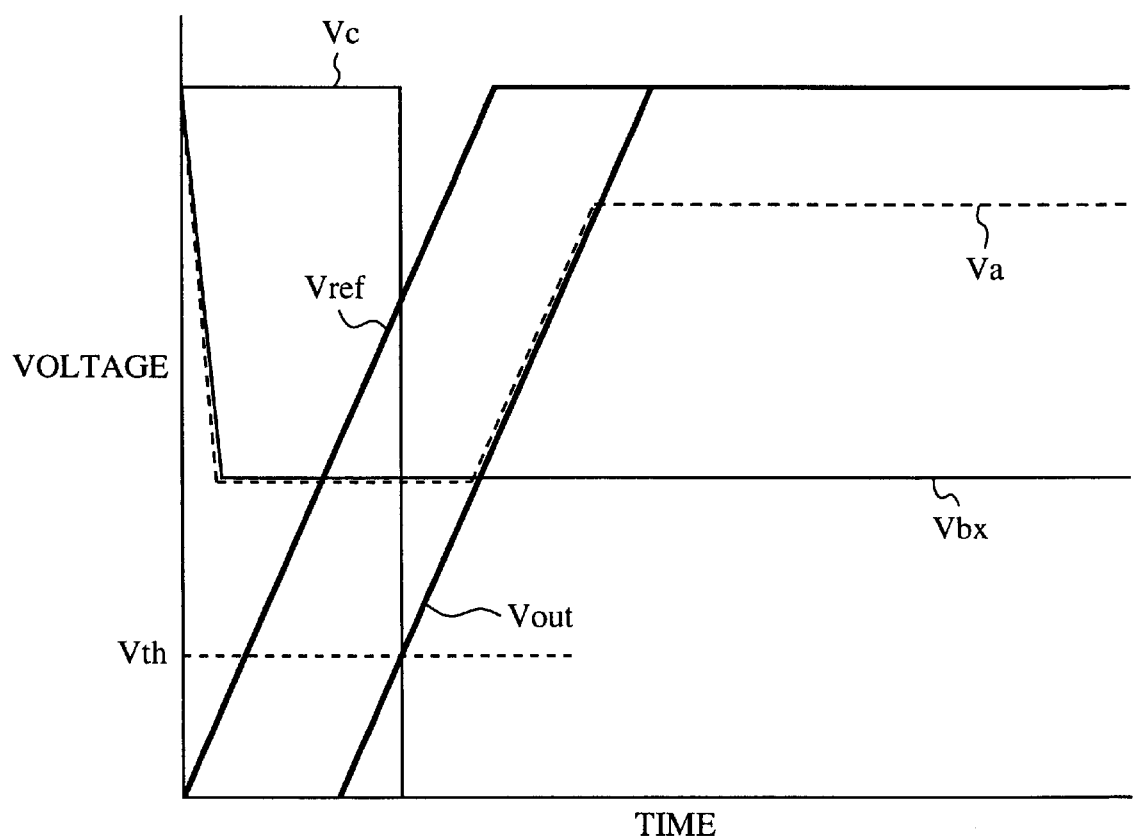
FIG. 9 is a graph illustrating variations in potentials at main points with time after a constant current source is turned on in the rising signal output circuit of the embodiment 5 in accordance with the present invention.

FIG. 9 is a graph illustrating temporal variations in the potentials at main points after the constant current source 22 is turned on in the rising signal output circuit of the present embodiment 5. When the constant current source 22 is turned on, the charge in the capacitor 23 increases, raising the voltage level of the capacitor 23. Thus, when the gate-source voltage of the source follower 24 exceeds the threshold voltage $V_{thn}$, the source follower 24 is turned on. In this case, the potential $V_a$ at the point A falls while the voltage level $V_{out}$ of the capacitive load 30 is low. As the potential $V_a$ falls triggered by the switching of the source follower 24, the potential $V_b$ also drops. In addition, since the voltage level $V_{out}$ of the capacitive load 30 is lower than the threshold voltage of the inverter 53, the potential $V_c$ at the point C is at the "H" level, and hence the MOS switch 51 is placed at the ON state. Accordingly, the points B and Bx are connected, and the potential $V_{bx}$ at the point Bx also drops with the drop of the potential $V_b$. As the potential $V_b$ drops, the gate-source voltage of the P-channel transistor 28 exceeds the threshold voltage $V_{thp2}$ so that it is turned on. Likewise, as the potential $V_{bx}$ drops, the gate-source voltage of the P-channel transistor 31 exceeds the threshold voltage $V_{thp3}$ so that it is turned on. Thus, the current $I_{out}$ flows into the capacitive load 30 from the voltage source 21 through the P-channel transistor 28 and source follower 24, and through the P-channel transistor 31. Here, the potential at the point B is uniquely determined such that the current flowing into the capacitive load 30 becomes equal to the $I_{out}$ given by expression (5).

With the elapse of the time from the foregoing state, the capacitive load 30 is being charged by the current $I_{out}$ so that the potential $V_{out}$ exceeds the threshold voltage $V_{th}$ of the inverter 53 as illustrated in FIG. 9. Accordingly, the potential $V_c$ at the point C is switched from the "H" level to the "L" level, bringing the MOS switch 51 into the OFF state. Thus, the point Bx is disconnected from the pint B so that the potential $V_{bx}$ is maintained at the fixed value. After that, the current corresponding to the capacitance $C_{load}$ of the capacitive load 30 flows into the capacitive load 30 through the transistor 31. Specifically, since the points A and B are connected, the gate-source voltage of the P-channel transistor 28 drops as the potential $V_a$ increases with the voltage level $V_{out}$, and when it drops below the threshold voltage $V_{thp2}$, the P-channel transistor 28 is turned off, and stops passing the current. However, since the potential $V_{bx}$ is maintained at the fixed value, the current corresponding to the capacitance $C_{load}$ of the capacitive load 30 continues flowing into the capacitive load 30 until its voltage level is raised to the supply voltage $V_{dd}$.

As described above, the rising signal output circuit of the present embodiment 5 can cover a wider range of the load capacitance because it can increase the range of the amount of the current flowing into the capacitive load 30 by increasing the range of the gate potentials of the P-channel transistors 28 and 31.

Figure 10:
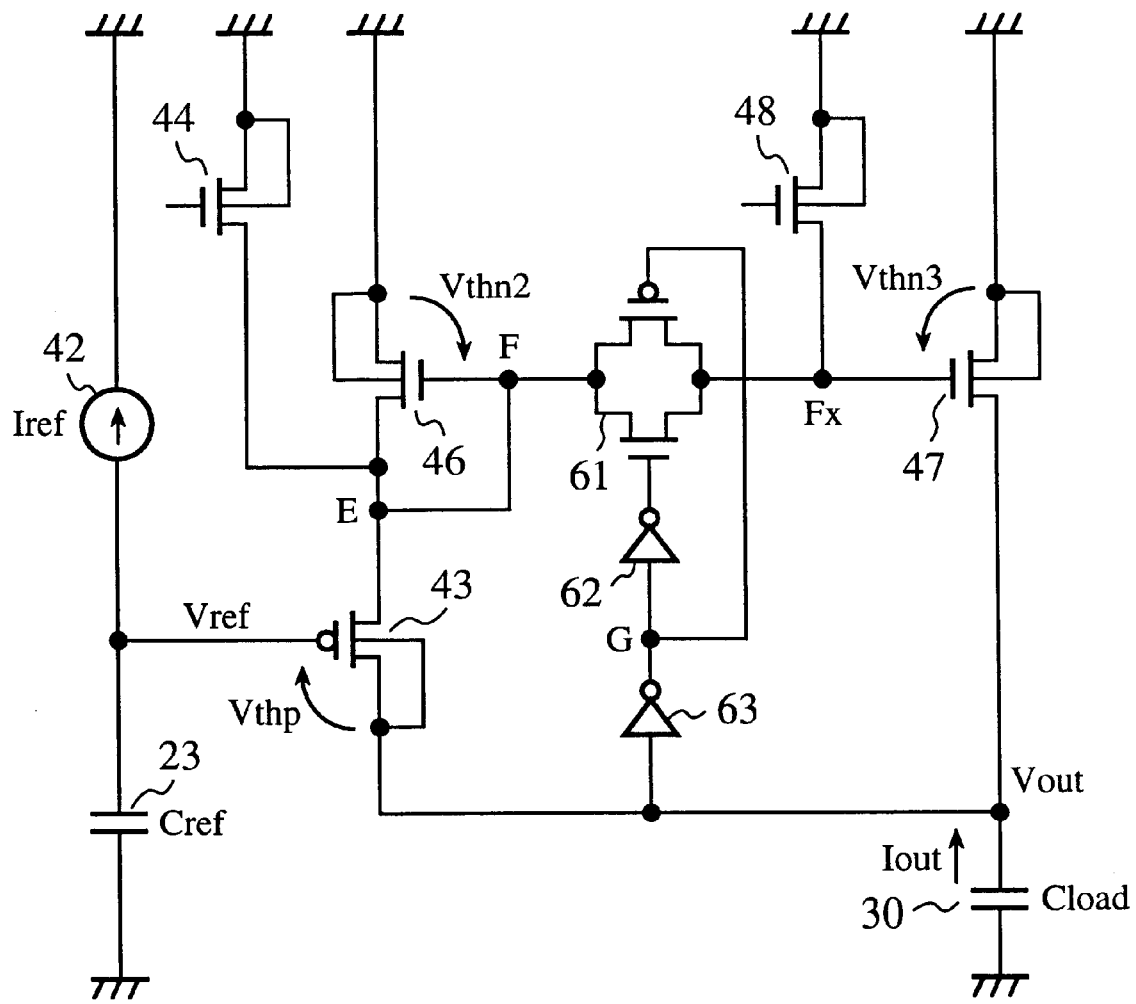
FIG. 10 is a circuit diagram showing a configuration of a falling signal output circuit constituting the output buffer of the embodiment 5 in accordance with the present invention.
Figure 11:
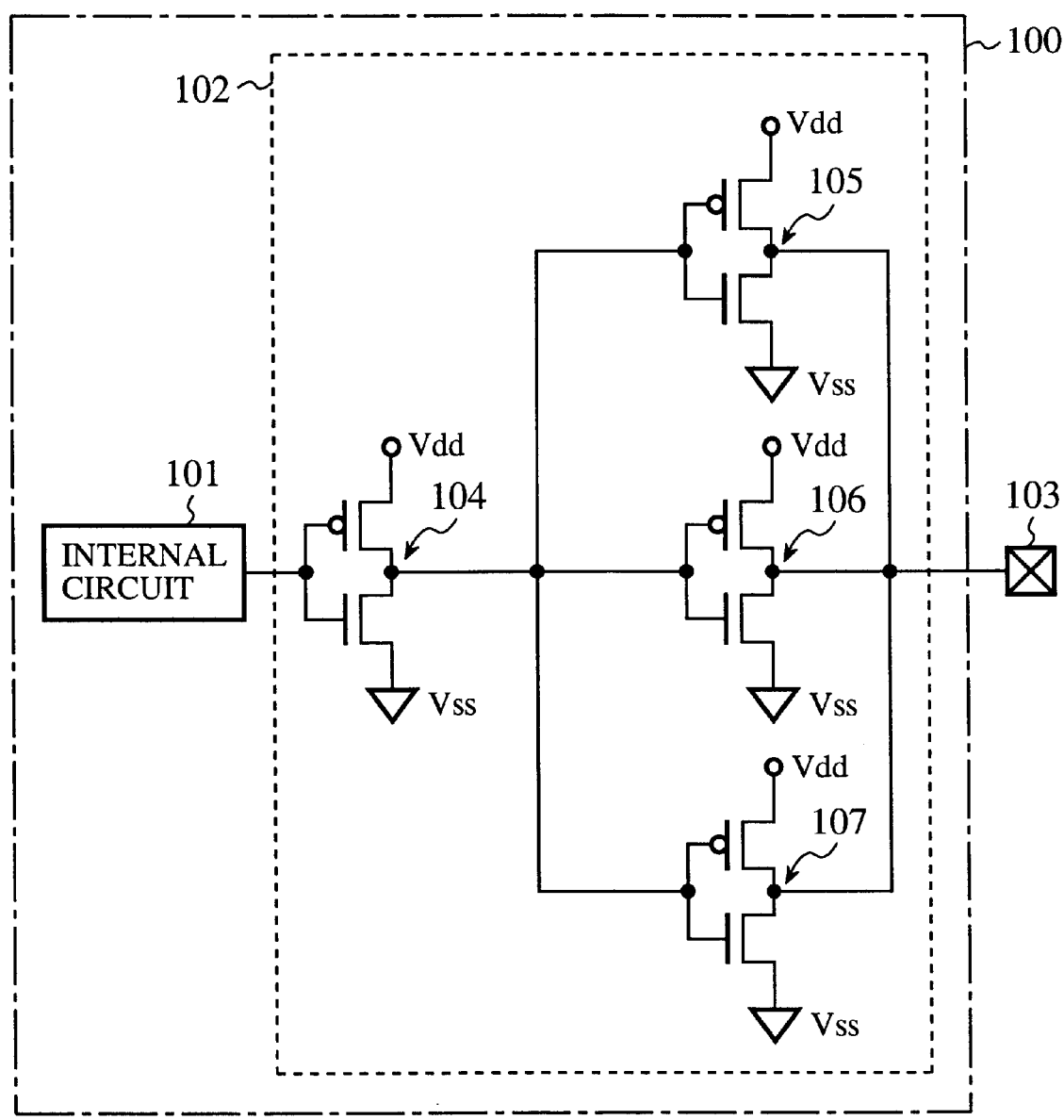
FIG. 11 is a circuit diagram showing a configuration of a semiconductor integrated circuit including a conventional output buffer.

Next, FIG. 10 is a circuit diagram showing a configuration of the falling signal output circuit of the output buffer of the embodiment 5 in accordance with the present invention. In FIG. 10, the same reference numerals designate the same or like portions to those of FIG. 7, and the description thereof is omitted here. In FIG. 10, major points in the operation of the falling signal output circuit are denoted by E, F, Fx and G to make it easy to identify them. The reference numeral 61 designates a MOS switch (T gate) for controlling connection and disconnection between the points F and Fx; and reference numerals 62 and 63 each designate an inverter. The points F and Fx are connected when the potential at the point G is at the "L" level, and disconnected when it is at the "H" level.

In the falling signal output circuit of the foregoing embodiment 4, because of the voltage $V_{thn1}$ between the points E and F, the upper limit of the potential $V_f$ at the point F becomes $V_{dd} - V_{thn1}$, where $V_{dd}$ is the supply voltage, and the range of the potential $V_f$ becomes $V_{dd}-V_{thn1} \geq V_f \geq 0$. Accordingly, when the supply voltage $V_{dd}$ is low, the range of the potential $V_f$ becomes narrow, and hence the controllable range of the amount of the current flowing out of the capacitive load 30 is also limited, resulting in a narrow load capacitance range. In view of this, the falling signal output circuit of the present embodiment increases the upper limit of the potential $V_f$ at the point F up to the $V_{dd}$ by connecting the points E and F.

Next, the operation of the falling signal output circuit of the present embodiment 5 will be described.

First, when the falling signal output circuit is in the disabled state, the "H" level signal is supplied to the gates of the N-channel transistors 44 and 48 to turn them on. Thus, the potentials at points E, F and Fx are maintained at zero volt, which brings the N-channel transistors 46 and 47 into the OFF state in the disabled state.

Subsequently, when the input signal falls to the "L" level, the falling signal output circuit shifts its state from the disabled state to the enabled state, and the gate potentials of the N-channel transistors 44 and 48 are placed at the "L" level. At the same time, the constant current source 42 is turned on.

In response to the discharge of the capacitor 23 after the constant current source 42 is turned on, the voltage level $V_{ref}$ of the capacitor 23 drops. Thus, when the gate-source voltage of the source follower 43 exceeds the threshold voltage $V_{thp}$, the source follower 43 is turned on. When the source follower 43 is turned on, it serves as a trigger to start increasing the potential $V_e$ at the point E, along with the potential $V_f$ at the point F. Since the voltage level $V_{out}$ of the capacitive load 30 is higher than the threshold voltage of the inverter 63, the potential $V_g$ at the point G is at the "L" level, and the points F and Fx are connected. Accordingly, the potential $V_{fx}$ at the point Fx increases with the increase of potential $V_f$. When the gate-source voltage of the N-channel transistor 46 exceeds the threshold voltage $V_{thn2}$ with the increase of the potential $V_f$, the N-channel transistor 46 is turned on. Likewise, when the gate-source voltage of the N-channel transistor 47 exceeds the threshold voltage $V_{thn3}$ with the increase of the potential $V_{fx}$, the N-channel transistor 47 is turned on. As a result, the current $I_{out}$ flows out of the capacitive load 30 to the ground through the N-channel transistor 46 and source follower 43, and through the N-channel transistor 47. In this case, the potential at the point F is uniquely determined such that the current flowing from the capacitive load 30 becomes equal to the value $I_{out}$ given by expression (5).

As the current $I_{out}$ flows out of the capacitive load 30, the voltage level $V_{out}$ of the capacitive load gradually reduces, and when it drops below the threshold voltage $V_{th}$ of the inverter 63, the potential $V_g$ at the point G is switched from the "L" level to the "H" level. In response to this, the MOS switch 61 is turned off, disconnecting the point Fx from the point F. Thus, the potential $V_{fx}$ is maintained at the fixed value so that the current corresponding to the capacitance $C_{load}$ of the capacitive load 30 continues to flow out of the capacitive load 30 through the transistor 47. Specifically, since the points E and F are connected, the gate-source voltage of the N-channel transistor 46 drops as the potential $V_e$ increases with the voltage level $V_{out}$, and when it drops below the threshold voltage $V_{thn2}$, the N-channel transistor 46 is turned off, and stops passing the current. However, since the potential $V_{fx}$ is maintained at the fixed value, the current corresponding to the capacitance $C_{load}$ of the capacitive load 30 continues flowing into the capacitive load 30 until its voltage level falls to zero volt.

As described above, the falling signal output circuit of the present embodiment 5 can cover a wider range of the load capacitance because it can increase the range of the amount of the current flowing out of the capacitive load 30 by increasing the range of the gate potentials of the N-channel transistors 46 and 47.

As described above, the present embodiment 5 is configured such that it comprises the source follower 24 (43) having its source connected to the capacitive load 30; the capacitor 23 connected to the gate of the source follower 24 (43); the constant current source 22 (42) connected to the capacitor 23 and the gate of the source follower 24 (43); the P-channel transistor 28 (N-channel transistor 46) connected between the drain of the source follower 24 (43) and the voltage source (ground), and having its gate connected to the drain of the source follower 24 (43); the P-channel transistor 31 (N-channel transistor 47) connected between the capacitive load 30 and the voltage source (ground); and the MOS switch 51 (61) connected between the gates of the P-channel transistors 28 and 31 (N-channel transistors 46 and 47). Accordingly, by turning on the source follower 24 (43) by supplying its gate with the constant gradient voltage, which is generated by the constant current source 22 (42) and the capacitor 23 using the transition of the input signal as a trigger, the P-channel transistors 28 and 31 (N-channel transistors 46 and 47) are turned on in response to the change in the drain potential of the source follower 24 (43), thereby passing the current approximately proportional to the capacitance $C_{ref}$ of the capacitive load 30. In addition, after the P-channel transistor 31 (N-channel transistor 47) is turned on, the MOS switch 51 (61) is turned off to maintain the gate potential of the P-channel transistor 31 (N-channel transistor 47), which makes it possible for the current corresponding to the capacitance $C_{load}$ of the capacitive load 30 to continue flowing until the voltage level of the capacitive load 30 completes its rising or falling. This offers an advantage of being able to provide the load driving power matching the load capacitance.

Furthermore, providing the P-channel transistor 31 (N-channel transistor 47) between the capacitive load 30 and the voltage source (ground) offers an advantage of being able to raise the voltage level of the capacitive load 30 to the supply voltage $V_{dd}$ or to drop it to zero volt.

Moreover, appropriately setting the amount of the current $I_{ref}$ supplied from the constant current source 22 (42) or the capacitance $C_{ref}$ of the capacitor 23 makes it possible to control the amount of the current $I_{out}$ flowing into or out of the capacitive load 30, offering an advantage of being able to establish the optimum slew rate and delay time.

In addition, since the drain potential of the source follower 24 (43) can be directly applied to the gates of the P-channel transistors 28 and 31 (N-channel transistor 46 and 47), the voltage range applicable to these transistors can be increased. This makes it possible to control the amount of the current flowing into or out of the capacitive load 30 in a wider range, offering an advantage of being able to increase the range of the load capacitance the output buffer can cover.

What is claimed is:

1. A load capacitance measuring circuit comprising:
   a reference capacitor;
   a constant current source connected in series with said reference capacitor, for generating a reference voltage with a constant gradient in said reference capacitor;
   a load resistor; and
   a transistor having its source connected to a capacitive load to be measured, its gate connected to a connecting point of said reference capacitor and said constant current source to be supplied with the reference voltage, and its drain connected to a voltage source via said load resistor, wherein a capacitance of the capacitive load is obtained from the drain voltage of said transistor and the gradient of the reference voltage.

2. The load capacitance measuring circuit according to claim 1, wherein a capacitance of said reference capacitor is variable.

3. The load capacitance measuring circuit according to claim 1, wherein a constant current said constant current source outputs is variable.

4. An output buffer comprising:

a reference capacitor;

a first constant current source connected in series with said reference capacitor, for generating a reference voltage with a constant gradient by charging said reference capacitor;

a first transistor having its source connected to a capacitive load, and its gate connected to a connecting point of said reference capacitor and said first constant current source to be supplied with the reference voltage;

a first switching device connected between the drain of said first transistor and a voltage source;

a second switching device connected between the capacitive load and the voltage source; and a first driver connected to a control terminal of said first switching device and to a control terminal of said second switching device, for switching said first switching device and said second switching device from an OFF state to an ON state when said first transistor is turned on.

5. The output buffer according to claim 4, further comprising:

a second constant current source connected in series with said reference capacitor, for changing the reference voltage at a constant rate by discharging said reference capacitor;

a second transistor having its source connected to the capacitive load, and its gate connected to a connecting point of said reference capacitor and said second constant current source to be supplied with the reference voltage;

a third switching device connected between the drain of said second transistor and a ground;

a fourth switching device connected between the capacitive load and the ground; and a second driver connected to a control terminal of said third switching device and to a control terminal of said fourth switching device, for switching said third switching device and said fourth switching device from an OFF state to an ON state when said second transistor is turned on.

6. The output buffer according to claim 5, wherein a capacitance of said reference capacitor is variable.

7. The output buffer according to claim 5, wherein a constant current supplied from said first constant current source to said reference capacitor is variable.

8. The output buffer according to claim 5, wherein a constant current discharged from said reference capacitor by said second constant current source is variable.

9. An output buffer comprising:

a reference capacitor;

a first constant current source connected in series with said reference capacitor, for generating a reference voltage with a constant gradient by charging said reference capacitor;

a first transistor having its source connected to a capacitive load, and its gate connected to a connecting point of said reference capacitor and said first constant current source to be supplied with the reference voltage;

a first switching device connected between the drain of said first transistor and a voltage source;

a second switching device connected between the capacitive load and the voltage source; and a third switching device that is connected between a control terminal of said first switching device and a control terminal of said second switching device, and controlled by a voltage across the capacitive load.

10. The output buffer according to claim 9, further comprising:

a second constant current source connected in series with said reference capacitor, for changing the reference voltage at a constant rate by discharging said reference capacitor;

a second transistor having its source connected to the capacitive load, and its gate connected to a connecting point of said reference capacitor and said second constant current source to be supplied with the reference voltage;

a fourth switching device connected between the drain of said second transistor and the ground;

a fifth switching device connected between the capacitive load and the ground; and a sixth switching device that is connected between a control terminal of said fourth switching device and a control terminal of said fifth switching device, and controlled by the voltage across the capacitive load.

11. The output buffer according to claim 10, wherein a capacitance of said reference capacitor is variable.

12. The output buffer according to claim 10, wherein a constant current supplied from said first constant current source to said reference capacitor is variable.

13. The output buffer according to claim 10, wherein a constant current discharged from said reference capacitor by said second constant current source is variable.

* * * * *